United States Patent
Arayashiki et al.

(10) Patent No.: US 9,779,808 B2
(45) Date of Patent: Oct. 3, 2017

(54) RESISTANCE RANDOM ACCESS MEMORY DEVICE AND METHOD FOR OPERATING SAME

(71) Applicant: TOSHIBA MEMORY CORPORATION, Tokyo (JP)

(72) Inventors: Yusuke Arayashiki, Yokkaichi (JP); Kikuko Sugimae, Kuwana (JP); Reika Ichihara, Yokohama (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/262,575

(22) Filed: Sep. 12, 2016

(65) Prior Publication Data

US 2017/0256310 A1   Sep. 7, 2017

Related U.S. Application Data

(60) Provisional application No. 62/304,608, filed on Mar. 7, 2016.

(51) Int. Cl.
| | |
|---|---|
| *G11C 11/00* | (2006.01) |
| *G11C 13/00* | (2006.01) |
| *H01L 27/24* | (2006.01) |
| *H01L 45/00* | (2006.01) |

(52) U.S. Cl.
CPC ........ *G11C 13/004* (2013.01); *G11C 13/0097* (2013.01); *H01L 27/249* (2013.01); *H01L 45/085* (2013.01); *H01L 45/1233* (2013.01); *H01L 45/1266* (2013.01); *H01L 45/146* (2013.01); *G11C 2213/33* (2013.01); *G11C 2213/34* (2013.01)

(58) Field of Classification Search
CPC .............................. G11C 11/00; G11C 13/004
USPC ............ 365/46, 94, 100, 113, 129, 148, 163
See application file for complete search history.

(56) References Cited

U.S. PATENT DOCUMENTS

| | | | |
|---|---|---|---|
| 6,888,773 B2 | 5/2005 | Morimoto | |
| 8,111,540 B2 * | 2/2012 | Asao | ....................... G11C 11/16 365/148 |
| 8,320,158 B2 | 11/2012 | Kanno et al. | |
| 8,541,768 B2 * | 9/2013 | Shima | ................. H01L 27/2409 257/2 |

FOREIGN PATENT DOCUMENTS

JP        2009-104715 A     5/2009

* cited by examiner

*Primary Examiner* — Harry W Byrne
(74) *Attorney, Agent, or Firm* — Foley & Lardner LLP

(57) ABSTRACT

A resistance random access memory device includes a control circuit. The control circuit applies a first voltage between the plurality of second interconnects and one of the first interconnects for a first time when switching resistance states of the variable resistance members from a first state to a second state, and the control circuit applies a second voltage between the plurality of second interconnects and the one of the first interconnects for a second time after applying the first voltage when the resistance state of one or more of the variable resistance members of a plurality of the variable resistance members connected to the one of the first interconnects is in the first state. The second voltage has the same polarity as the first voltage and is lower than the first voltage. The second time is longer than the first time.

8 Claims, 12 Drawing Sheets

LOW RESISTANCE STATE

HIGH RESISTANCE STATE

BREAKDOWN STATE

PRIOR TO ERASING OPERATION

APPLYING FIRST ERASING PULSE

SENSING

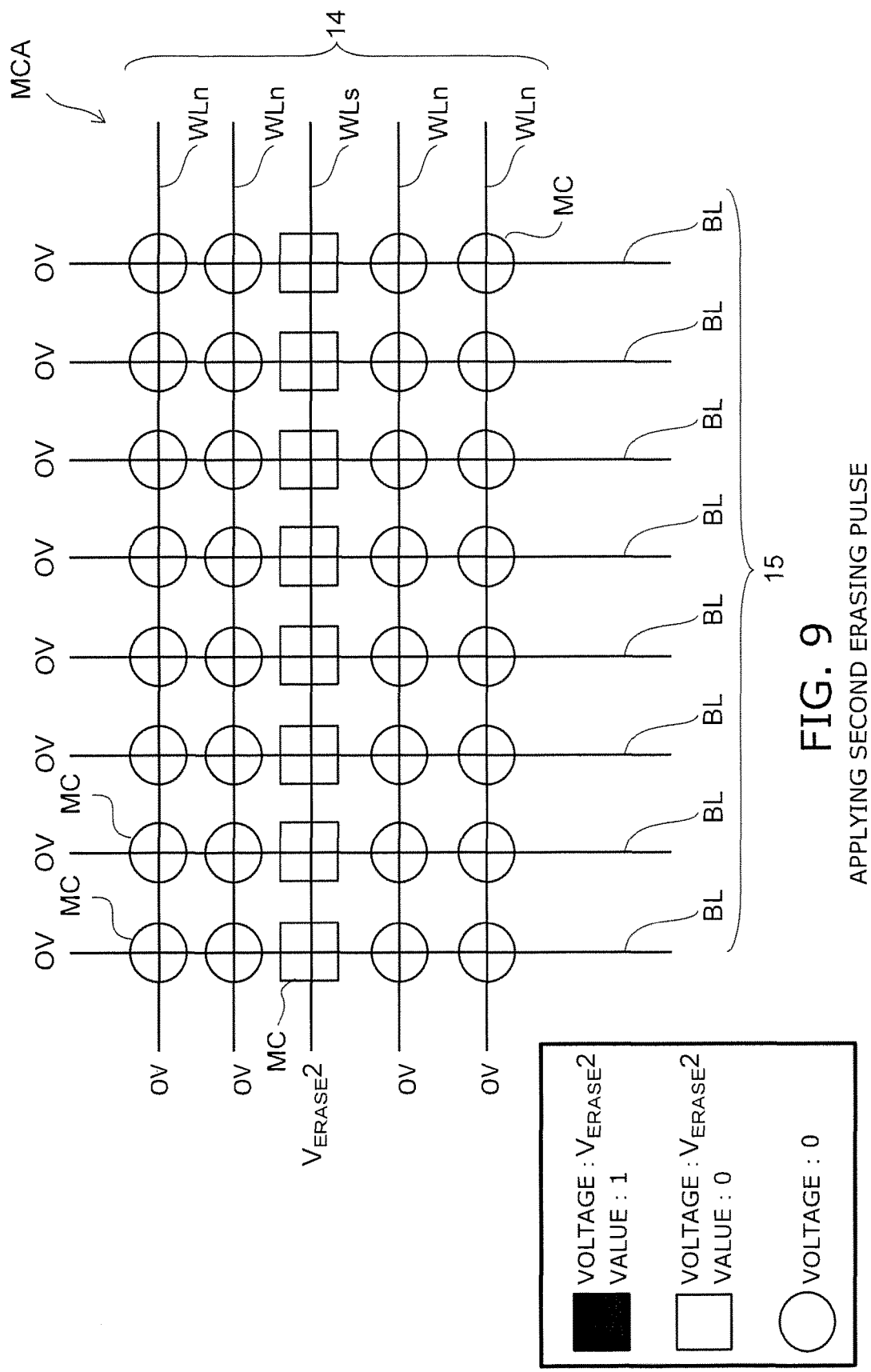
FIG. 9 APPLYING SECOND ERASING PULSE

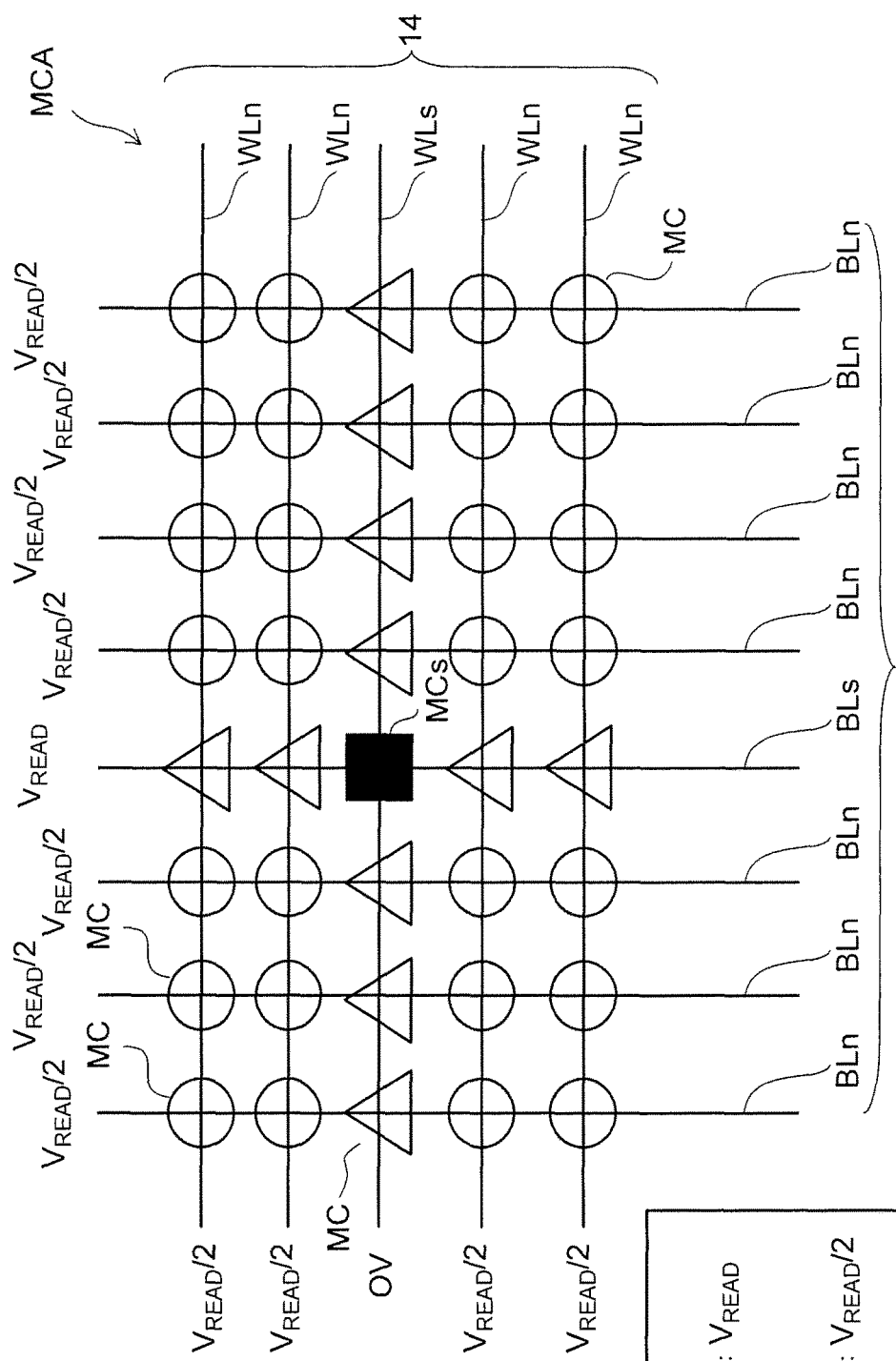
FIG. 12 SENSING

RESISTANCE RANDOM ACCESS MEMORY DEVICE AND METHOD FOR OPERATING SAME

CROSS-REFERENCE TO RELATED APPLICATIONS

This application is based upon and claims the benefit of priority from U.S. Provisional Patent Application 62/304,608, filed on Mar. 7, 2016; the entire contents of which are incorporated herein by reference.

FIELD

Embodiments relate to a resistance random access memory device and a method for operating the same.

BACKGROUND

In recent years, the downscaling of memory cells in a planar nonvolatile memory device has been approaching a limit. Therefore, many devices have been proposed as a next-generation memory device in which the memory cells are arranged three-dimensionally. Among these, for higher integration, it is considered that a cross-point memory device is advantageous in which a word line interconnect layer including multiple word lines and a bit line interconnect layer including multiple bit lines are stacked alternately and variable resistance members are connected between the word lines and the bit lines.

BRIEF DESCRIPTION OF THE DRAWINGS

FIG. 7 to FIG. 9 are drawings showing potentials applied to interconnects and states of the memory cells in the erasing operation of the resistance random access memory device according to the first embodiment;

FIG. 12 is a drawing showing potentials applied to interconnects in the erasing operation of the resistance random access memory device according to second the embodiment.

DETAILED DESCRIPTION

Figure 1:
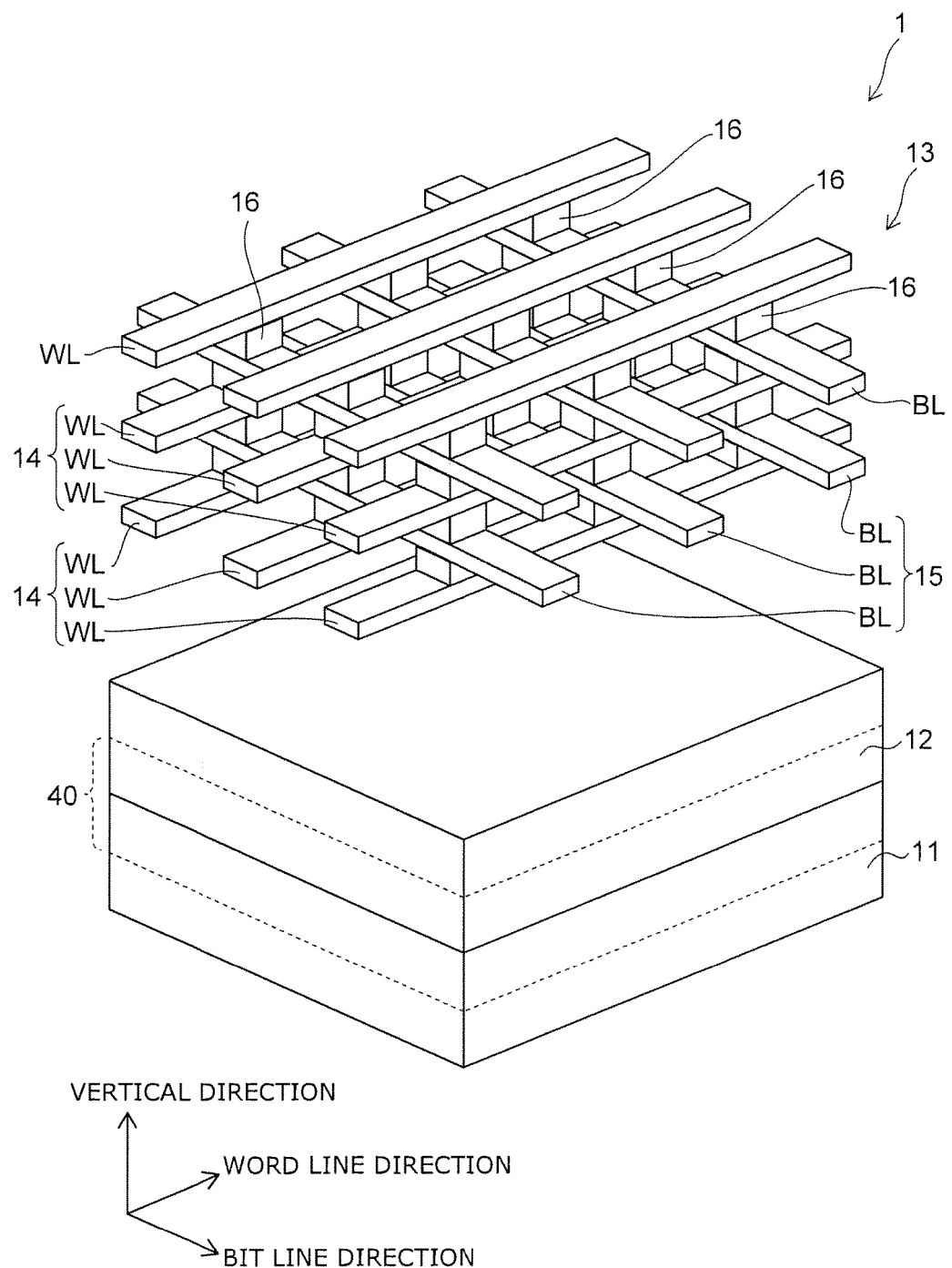
FIG. 1 is a perspective view showing a resistance random access memory device according to a first embodiment.

A resistance random access memory device according to an embodiment includes a first interconnect layer, a second interconnect layer, variable resistance members and a control circuit. The first interconnect layer includes a plurality of first interconnects extending in a first direction and being arranged along a second direction crossing the first direction. The second interconnect layer includes a plurality of second interconnects extending in the second direction and being arranged along the first direction. The second interconnect layer is arranged in a third direction with the first interconnect layer. The third direction is orthogonal to both the first direction and the second direction. The variable resistance members are connected between the first interconnects and the second interconnects. The control circuit applies a first voltage between the plurality of second interconnects and one of the first interconnects for a first time when switching resistance states of the variable resistance members from a first state to a second state, and the control circuit applies a second voltage between the plurality of second interconnects and the one of the first interconnects for a second time after applying the first voltage when the resistance state of one or more of the variable resistance members of a plurality of the variable resistance members connected to the one of the first interconnects is in the first state. The second voltage has the same polarity as the first voltage and is lower than the first voltage. The second time is longer than the first time.

A resistance random access memory device according to an embodiment includes a first interconnect layer, a second interconnect layer, variable resistance members and a control circuit. The first interconnect layer includes a plurality of first interconnects extending in a first direction and being arranged along a second direction crossing the first direction. The second interconnect layer includes a plurality of second interconnects extending in the second direction and being arranged along the first direction. The second interconnect layer is arranged in a third direction with the first interconnect layer. The third direction is orthogonal to both the first direction and the second direction. The variable resistance members are connected between the first interconnects and the second interconnects. The variable resistance member includes a metal layer and a variable resistance layer disposed between the first interconnect and the metal layer. A resistivity of the variable resistance layer is higher than a resistivity of the metal layer. The control circuit applies a first voltage to the variable resistance member for a first time when switching the variable resistance member from a low resistance state to a high resistance state. The first voltage makes a potential of the first interconnect higher than a potential of the second interconnect. The control circuit applies a second voltage to the variable resistance member for a second time after applying the first voltage when the resistance state of the variable resistance member is in the low resistance state. The second voltage has the same polarity as the first voltage and is lower than the first voltage, the second time is longer than the first time.

A method for operating a resistance random access memory device according to an embodiment includes switching resistance states of variable resistance members from a first state to a second state. The resistance random access memory device includes a first interconnect layer, a second interconnect layer, and the variable resistance members. The first interconnect layer includes a plurality of first interconnects extending in a first direction and being arranged along a second direction crossing the first direction. The second interconnect layer includes a plurality of second interconnects extending in the second direction and being arranged along the first direction. The second interconnect layer is arranged in a third direction with the first interconnect layer. The third direction is orthogonal to both the first direction and the second direction. The variable resistance members are connected between the first interconnects and the second interconnects. The switching includes applying a first voltage between the plurality of second interconnects and one of the first interconnects for a first time. The switching includes applying a second voltage between the plurality of second interconnects and the one of the first interconnects for a second time after applying the first voltage when the resistance state of one or more of the variable resistance members of a plurality of the variable resistance members connected to the one of the first interconnects is in the first state. The second voltage has the same polarity as the first voltage and is lower than the first voltage. The second time is longer than the first time.

First Embodiment

First, a first embodiment will be described.

FIG. 1 is a perspective view showing a resistance random access memory device according to the embodiment.

Figure 2:
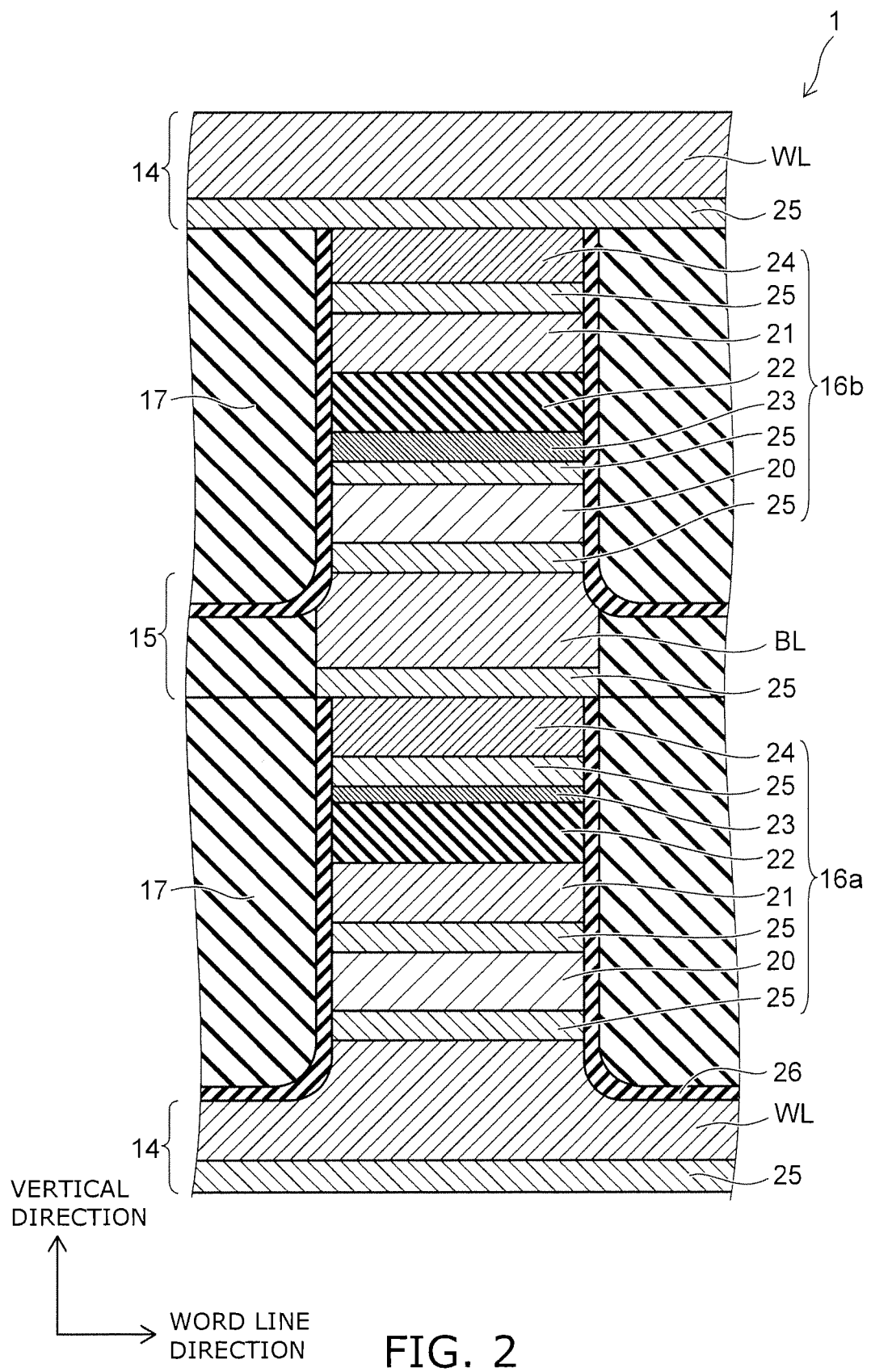
FIG. 2 is a cross-sectional view showing the resistance random access memory device according to the first embodiment.

FIG. 2 is a cross-sectional view showing the resistance random access memory device according to the embodiment.

The resistance random access memory device according to the embodiment is a nonvolatile memory device and is a CBRAM (Conductive Bridging Random Access Memory).

In the resistance random access memory device 1 (hereinbelow, also called simply the "device 1") according to the embodiment as shown in FIG. 1, a control circuit 40 that operates a memory cell unit 13 is formed of transistors formed on a silicon substrate 11 and interconnect layers connecting the transistors as a circuit; and the memory cell unit 13 is provided on the control circuit 40. The gate structures and interconnect layers of the transistors are provided inside an inter-layer insulating film 12.

In the memory cell unit 13, multiple word line interconnect layers 14 and multiple bit line interconnect layers 15 are stacked alternately along a direction (hereinbelow, called the "vertical direction") perpendicular to the upper surface of the silicon substrate 11. Multiple word lines WL are provided in each of the word line interconnect layers 14. The multiple word lines WL extend in one direction (hereinbelow, called the "word line direction") that is parallel to the upper surface of the silicon substrate 11 and are arranged along a direction (hereinbelow, called the "bit line direction") that is parallel to the upper surface of the silicon substrate 11 and crosses, e.g., is orthogonal to, the word line direction. Multiple bit lines BL that extend in the bit line direction and are arranged along the word line direction are provided in each of the bit line interconnect layers 15. The word lines WL do not contact each other; the bit lines BL do not contact each other; and the word lines WL do not contact the bit lines BL. Contacts (not illustrated) for connecting the word lines WL and the bit lines BL to the lower layer interconnect layer are formed at the end portion of each of the word lines WL and each of the bit lines BL. The control circuit 40 that is provided in the lower layer performs the operations of controlling the voltages applied to each of the bit lines BL and each of the word lines WL, sensing the amount of current flowing in the interconnects, etc.

Also, a pillar 16 that extends in the vertical direction is provided at each most proximal point between the word lines WL and the bit lines BL. The pillar 16 is a variable resistance member having two resistance states; and the configuration of the pillar 16 is, for example, a circular columnar configuration, a quadrilateral prism configuration, or a substantially quadrilateral prism configuration having rounded corners. The pillar 16 is connected between the word line WL and the bit line BL; and one memory cell includes one pillar 16. In other words, the device 1 is a cross-point device in which the memory cells are disposed at each most proximal point between the word lines WL and the bit lines BL. A burying film 17 (referring to FIG. 2) fills between the word lines WL, between the bit lines BL, and between the pillars 16.

The configuration of the pillar 16 will now be described.

As shown in FIG. 2, the pillars 16 include a pillar 16a having the word line WL disposed below the pillar 16a, i.e., on the silicon substrate 11 side (referring to FIG. 1), and having the bit line BL disposed above the pillar 16a; and the pillars 16 include a pillar 16b having the bit line BL disposed below the pillar 16b and having the word line WL disposed above the pillar 16b.

In the pillar 16a, a current-limiting layer 20, an electrode layer 21, a variable resistance layer 22, and an ionized metal layer 23 are provided from below, that is, from the word line WL side, upward, that is, toward the bit line BL side; and a stopper metal layer 24 that is used as a stopper in the planarizing process of the burying film is provided on the ionized metal layer 23. A barrier metal layer 25 that is made of titanium, titanium nitride, tantalum, tantalum nitride, etc., is provided between the current-limiting layer 20 and the word line WL of the lower layer, between the current-limiting layer 20 and the electrode layer 21, and between the ionized metal layer 23 and the stopper metal layer 24 to improve the adhesion and suppress the diffusion of metallic elements. The barrier metal layer 25 may not be provided. Also, the region of the upper surface of the word line WL of the lower layer that is covered with the pillar 16a is positioned higher than the other regions of the upper surface of the word line WL of the lower layer. This is because the portion of the upper layer portion of the word line WL not covered with the pillar 16a is dug out when patterning the pillar 16a. A liner film 26 is provided to cover the side surface of the pillar 16a and the upper surface of the word line WL of the lower layer. The burying film 17 fills between the pillars 16a.

In the pillar 16b, the current-limiting layer 20, the ionized metal layer 23, the variable resistance layer 22, and the electrode layer 21 are provided from below, that is, from the bit line BL side, upward, that is, toward the word line WL side; and the stopper metal layer 24 that is used as a stopper in the planarizing process of the burying film is provided on the electrode layer 21. The barrier metal layer 25 is provided between the current-limiting layer 20 and the bit line BL of the lower layer, between the current-limiting layer 20 and the ionized metal layer 23, and between the electrode layer 21 and the stopper metal layer 24. The barrier metal layer 25 may not be provided. Also, the region of the upper surface of the bit line BL of the lower layer that is covered with the pillar 16*b* is positioned higher than the other regions of the upper surface of the bit line BL of the lower layer due to the patterning of the pillar 16*b*. The liner film 26 is provided to cover the side surface of the pillar 16*b* and the upper surface of the bit line BL of the lower layer. The burying film 17 fills between the pillars 16*b*.

Accordingly, for the variable resistance layer 22 and the ionized metal layer 23 that belong to the same pillar 16, the variable resistance layer 22 always is disposed on the word line WL side; and the ionized metal layer 23 always is disposed on the bit line BL side. In other words, the variable resistance layer 22 is disposed between the word line WL and the ionized metal layer 23; and the ionized metal layer 23 is disposed between the bit line BL and the variable resistance layer 22.

The ionized metal layer 23 is a simple metal layer that includes an easily-ionizable metal, an alloy layer of one or more different types of metals, or a compound layer made of a compound such as an oxide, a nitride, etc., and is formed of, for example, silver (Ag), copper (Cu), nickel (Ni), etc. The variable resistance layer 22 is a film in which the ions of the metal included in the ionized metal layer 23, e.g., silver ions ($Ag^+$, etc.), can pass through reversibly and is formed of, for example, a metal compound such as silicon oxide ($SiO_2$), silicon nitride ($Si_3N_4$), aluminum oxide ($Al_2O_3$), hafnium oxide ($HfO_2$), etc. The resistivity of the variable resistance layer 22 not penetrated by the metal ions is higher than the resistivity of the ionized metal layer 23.

As described below, the variable resistance layer 22 may have the two states of a low resistance state and a high resistance state. The operation as a memory device is performed by programming, erasing, and reading the difference of the resistances of the two states by the control circuit. The electrode layer 21 is formed from amorphous silicon, polysilicon, etc., and functions as a layer that prevents an excessive current from flowing undesirably when the variable resistance layer 22 transitions from the high resistance state to the low resistance state. The current-limiting layer 20 is formed of, for example, an oxide of titanium (Ti) and/or tantalum (Ta), a nitride of titanium (Ti) and/or tantalum (Ta), a mixture of silicon (Si) and such metals, etc., and is formed similarly to the electrode layer 21 to suppress short defects from occurring due to a current flowing excessively inside the element and the control circuit when the element is caused to have the low resistance. It is sufficient for the current-limiting layer 20 to be formed at either the upper portion or the lower portion of the element made of the ionized metal layer 23, the variable resistance layer 22, and the electrode layer 21; and, for example, as shown in FIG. 2, it is not always necessary to be formed at a position having vertical symmetry when forming the reverse structure. Also, because the electrode layer 21 and the current-limiting layer 20 are layers having similar functions, either one of the electrode layer 21 or the current-limiting layer 20 may be omitted according to the characteristics of the element. The liner film 26 is formed from silicon nitride, etc., and is formed to protect the metal layers included in the element from the oxidation atmosphere when forming the burying film. The burying film 17 is formed from a silicon oxide film, etc. The word line WL and the bit line BL are formed from a metal material such as tungsten, etc.

A method for operating the resistance random access memory device according to the embodiment will now be described.

Figures 3A, 3B, 3C:
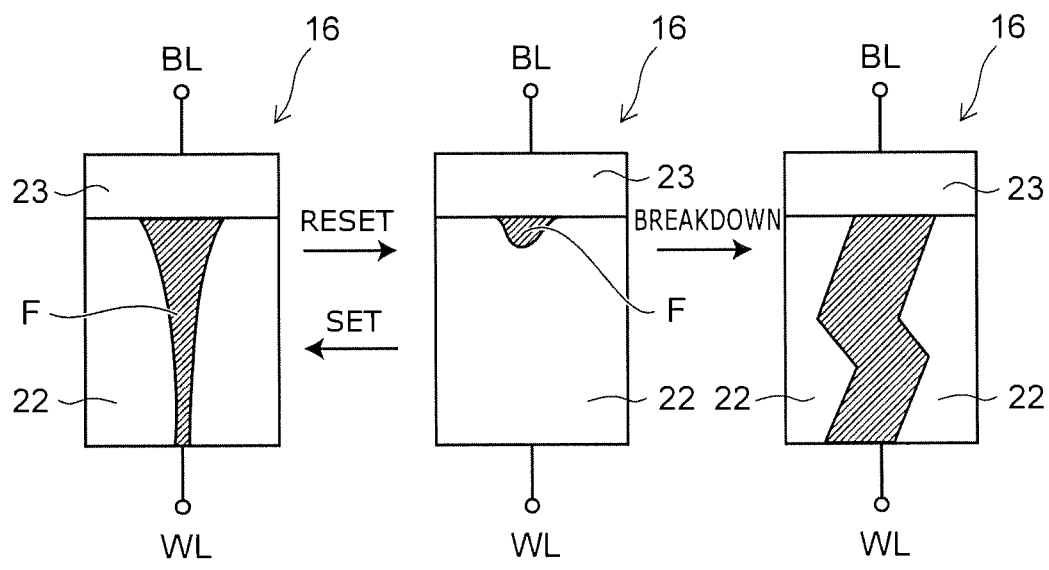
FIG. 3A to FIG. 3C are schematic cross-sectional views showing states of the resistance random access memory device according to the first embodiment.

FIG. 3A to FIG. 3C are schematic cross-sectional views showing states of the resistance random access memory device according to the embodiment.

As shown in FIG. 3A and FIG. 3B, each pillar 16 that is included in the memory cell may have the two types of resistance states of the low resistance state and the high resistance state. Inside the variable resistance layer 22 made of, for example, silicon oxide in the low resistance state as shown in FIG. 3A, a filament F made of, for example, silver is formed to pierce the variable resistance layer 22; and the filament F is used as a current path. Inside the variable resistance layer 22 in the high resistance state as shown in FIG. 3B, the filament F is broken or disappears and is not configured as a current path.

The operation of transitioning from the high resistance state to the low resistance state is called the set. In the set, a set voltage in which the bit line BL is set to be positive and the word line WL is set to be negative is applied to the pillar 16 in the high resistance state shown in FIG. 3B. "Positive" and "negative" are a relative relationship; both may be positive potentials; or one of the two may be the ground potential. Thereby, silver atoms (Ag) that are included in the ionized metal layer 23 are ionized, become silver ions ($Ag^+$), and move through the variable resistance layer 22 toward the word line WL which is negative. Then, inside the variable resistance layer 22, the silver ions that have moved from the ionized metal layer 23 precipitate by combining with electrons supplied from the word line WL. Thereby, as shown in FIG. 3A, the filament F is formed inside the variable resistance layer 22; and the state is switched to the low resistance state.

On the other hand, the operation of transitioning from the low resistance state to the high resistance state is called the reset. In the reset, a reset voltage in which the bit line BL is set to be negative and the word line WL is set to be positive is applied to the pillar 16 in the low resistance state shown in FIG. 3A. Thereby, the silver atoms included in the filament F are ionized, become silver ions, and move toward the bit line BL which is negative. Then, inside the ionized metal layer 23, the silver ions that have moved from the variable resistance layer 22 precipitate by combining with electrons supplied from the bit line BL. Thereby, as shown in FIG. 3B, at least a portion of the filament F disappears; the current path is broken; and the state is switched to the high resistance state.

In the reset, a high voltage is applied to the variable resistance layer 22 as soon as the filament F is broken. Therefore, if the reset voltage is set to be excessively high, there are cases where dielectric breakdown of the variable resistance layer 22 occurs as shown in FIG. 3C. The change is irreversible; and breakdown of the memory cell MC itself undesirably occurs.

In the embodiment, for example, the value of the memory cell including the pillar 16 which is in the low resistance state is called "1;" and the value of the memory cell including the pillar 16 which is in the high resistance state is called "0." Also, the operation of selectively programming the value "1" in a block in which all of the values of the memory cells are "0" is called the program operation; the operation of sensing whether the values of the memory cells belonging to the block are "0" or "1" is called the read operation; and setting all of the values of the memory cells belonging to the block to "0" is called the erasing operation. In the erasing operation, the values of the memory cells having the value "0" prior to the erasing operation remain set to "0;" and for the memory cells having the value "1" prior to the erasing operation, the reset is performed and the values are set to "0."

The erasing operation will now be described in detail.

First, the state prior to the erasing operation will be described.

Figure 4:
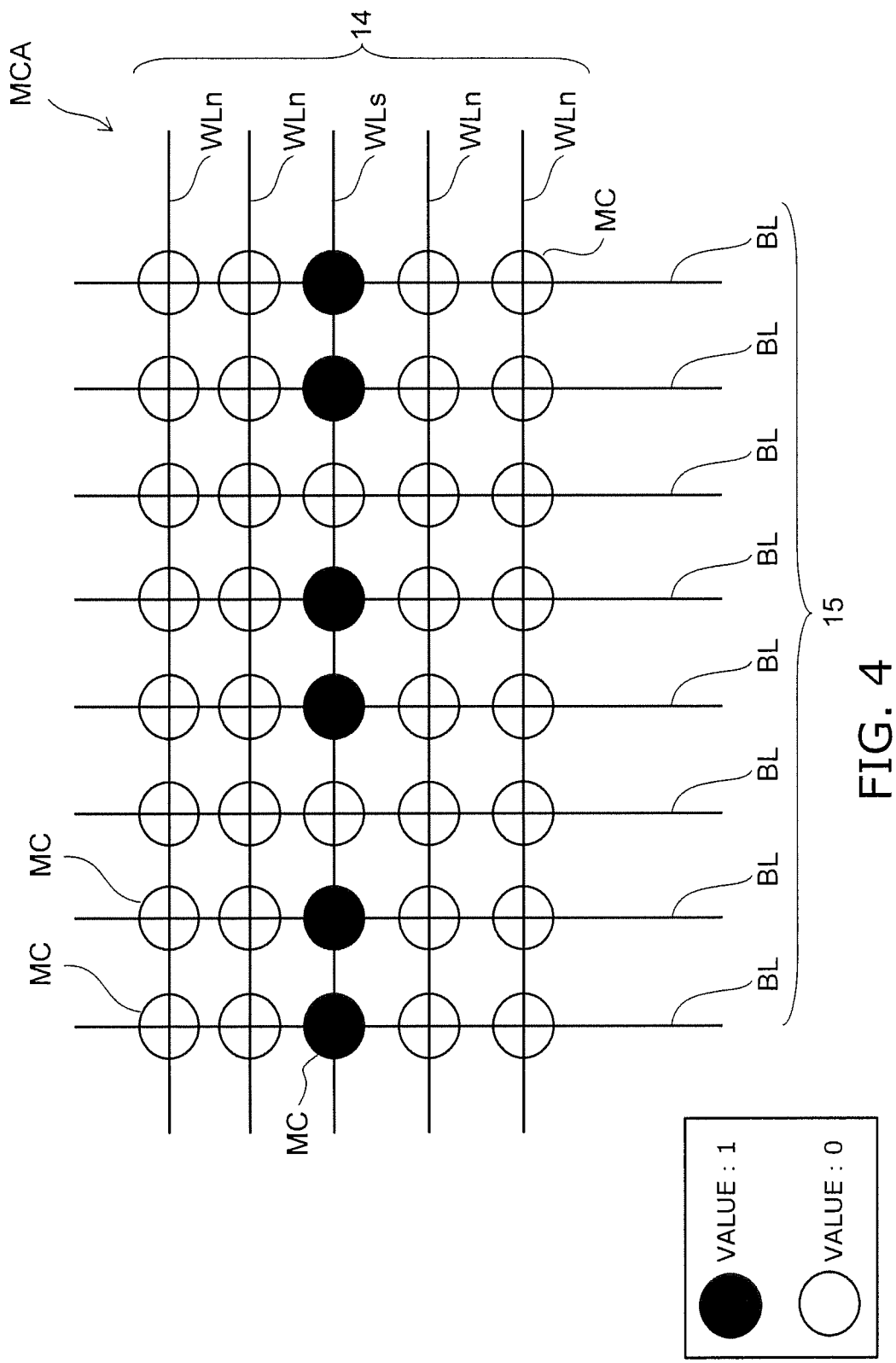
FIG. 4 is a drawing showing state of the memory cells prior to an erasing operation in the resistance random access memory device according to the first embodiment.

FIG. 4 is a drawing showing the state of the memory cells prior to the erasing operation in the resistance random access memory device according to the embodiment.

As shown in FIG. 4, in a memory cell array MCA made of the multiple memory cells MC disposed between the word line interconnect layer 14 of one layer and the bit line interconnect layer 15 of one layer, the group made of the multiple memory cells connected to one word line WL is called "one page." In the embodiment, the erasing operation is performed collectively for the multiple memory cells connected to the one word line WL. In other words, the erasing operation is performed by page.

In the specification, one word line WL of the word lines WL belonging to the word line interconnect layer 14 that is to be erased is called the "selected word line WLs;" and the word lines WL other than the "selected word line WLs" are called the "unselected word lines WLn." The memory cells MC that are connected to the selected word line WLs are called the "memory cells belonging to the selected page."

Prior to the erasing operation, the memory cells MC having the value "1" and the memory cells MC having the value "0" coexist. In FIG. 4, among the memory cells belonging to the selected page, the black circles (•) show the memory cells MC having the value "1;" and the white circles (○) show the memory cells MC having the value "0." The values are not shown for the memory cells MC connected to the unselected word lines WLn.

The erasing operation is started from this state.

Figure 5:
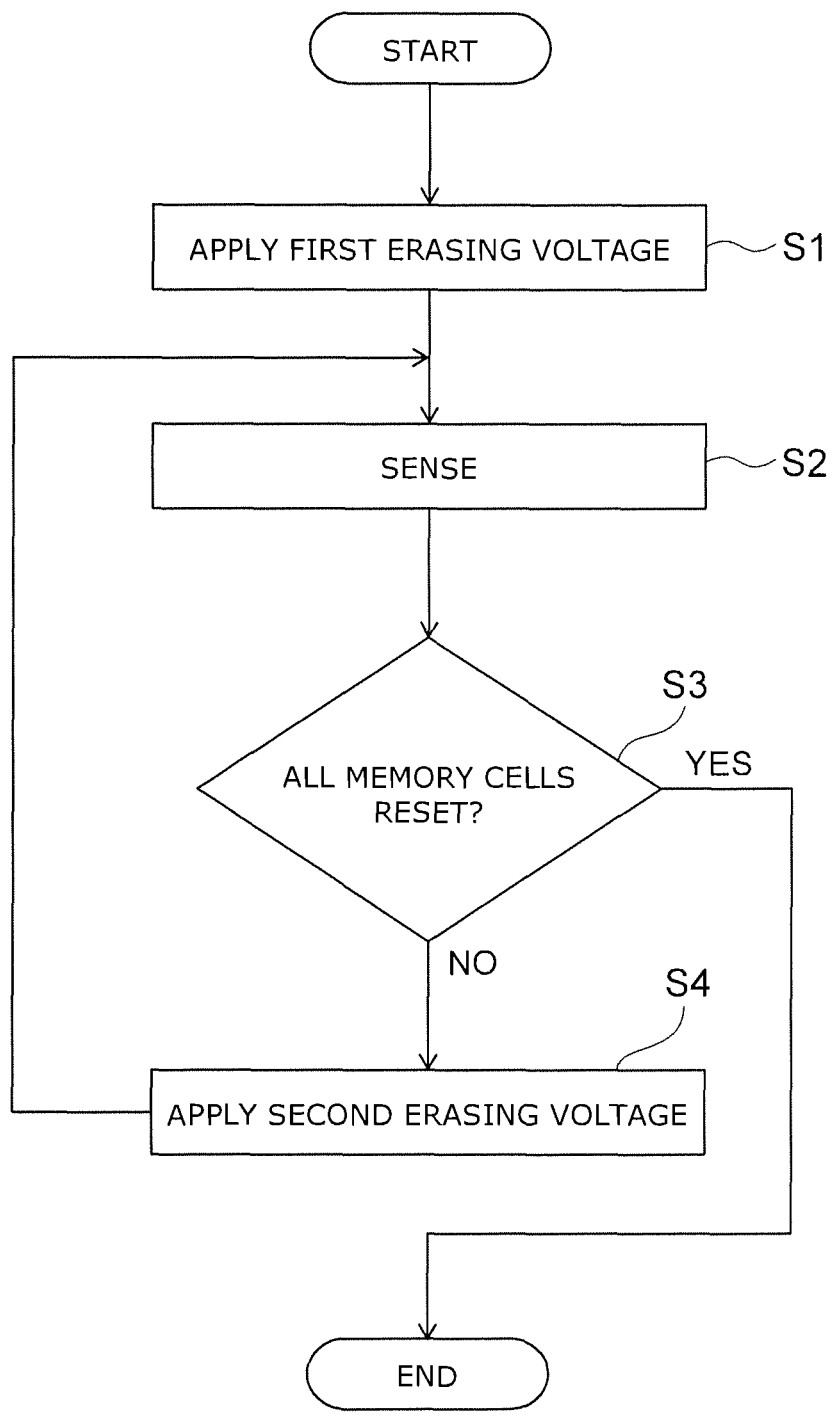
FIG. 5 is a flowchart showing the erasing operation of the resistance random access memory device according to the first embodiment.

FIG. 5 is a flowchart showing the erasing operation of the resistance random access memory device according to the embodiment.

Figure 6:
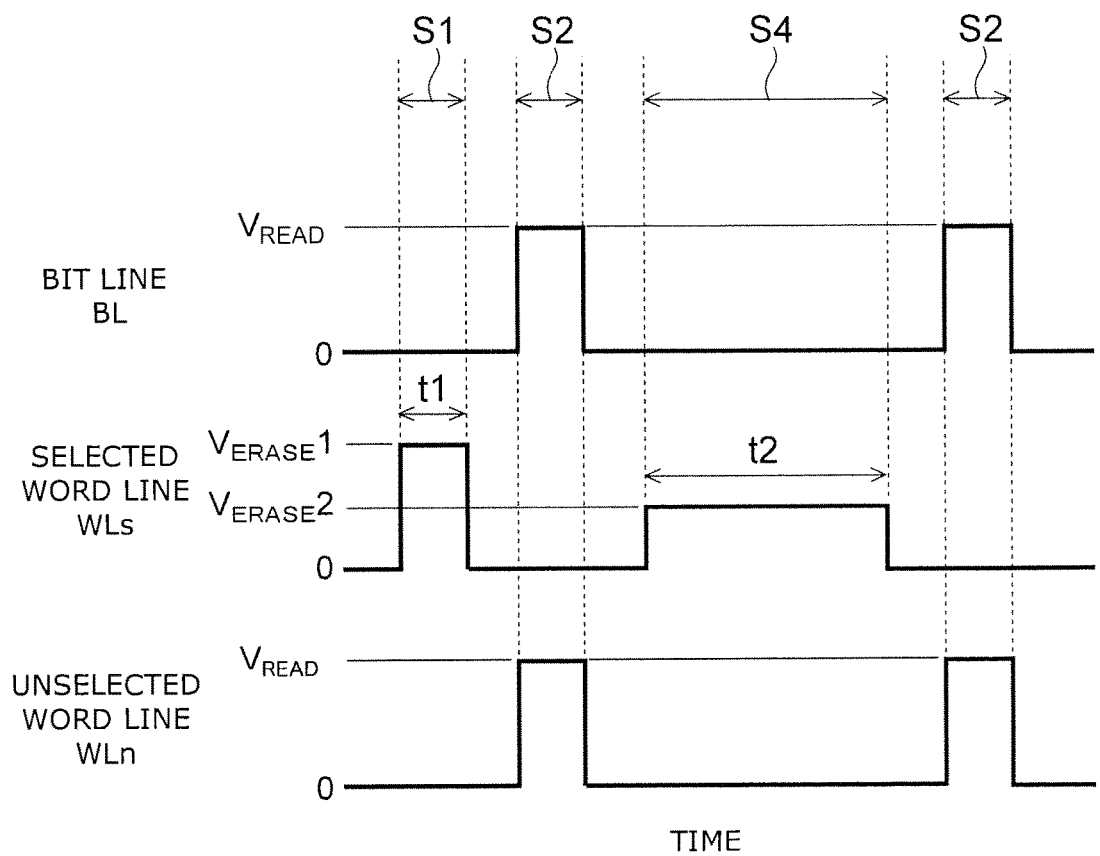
FIG. 6 is a waveform diagram showing the erasing operation of the resistance random access memory device according to the first embodiment, in which the horizontal axis is the time, and the vertical axis is the potential of each unit.

FIG. 6 is a waveform diagram showing the erasing operation of the resistance random access memory device according to the embodiment, in which the horizontal axis is the time, and the vertical axis is the potential of each unit.

Figure 7:
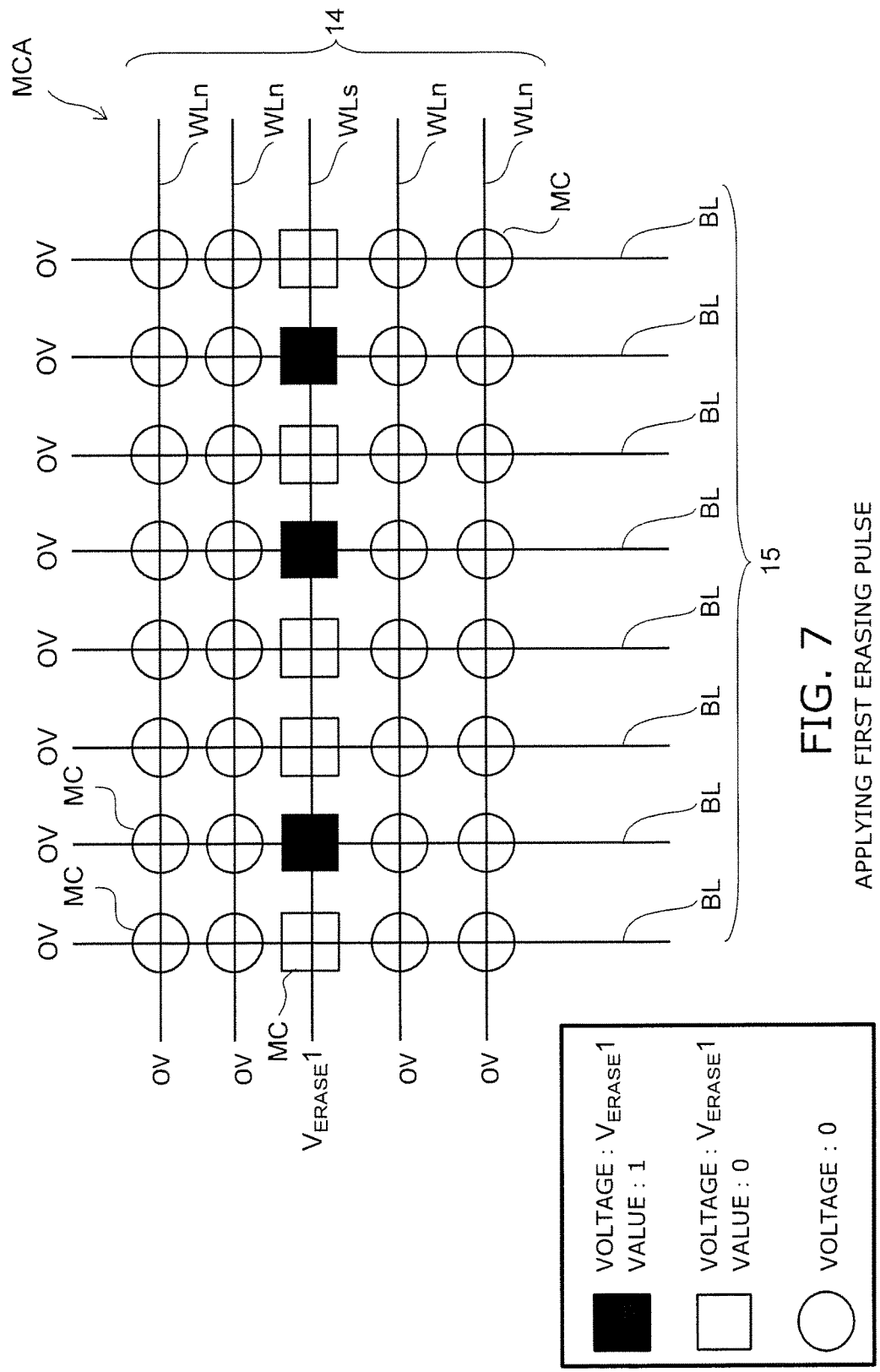
Figure 8:
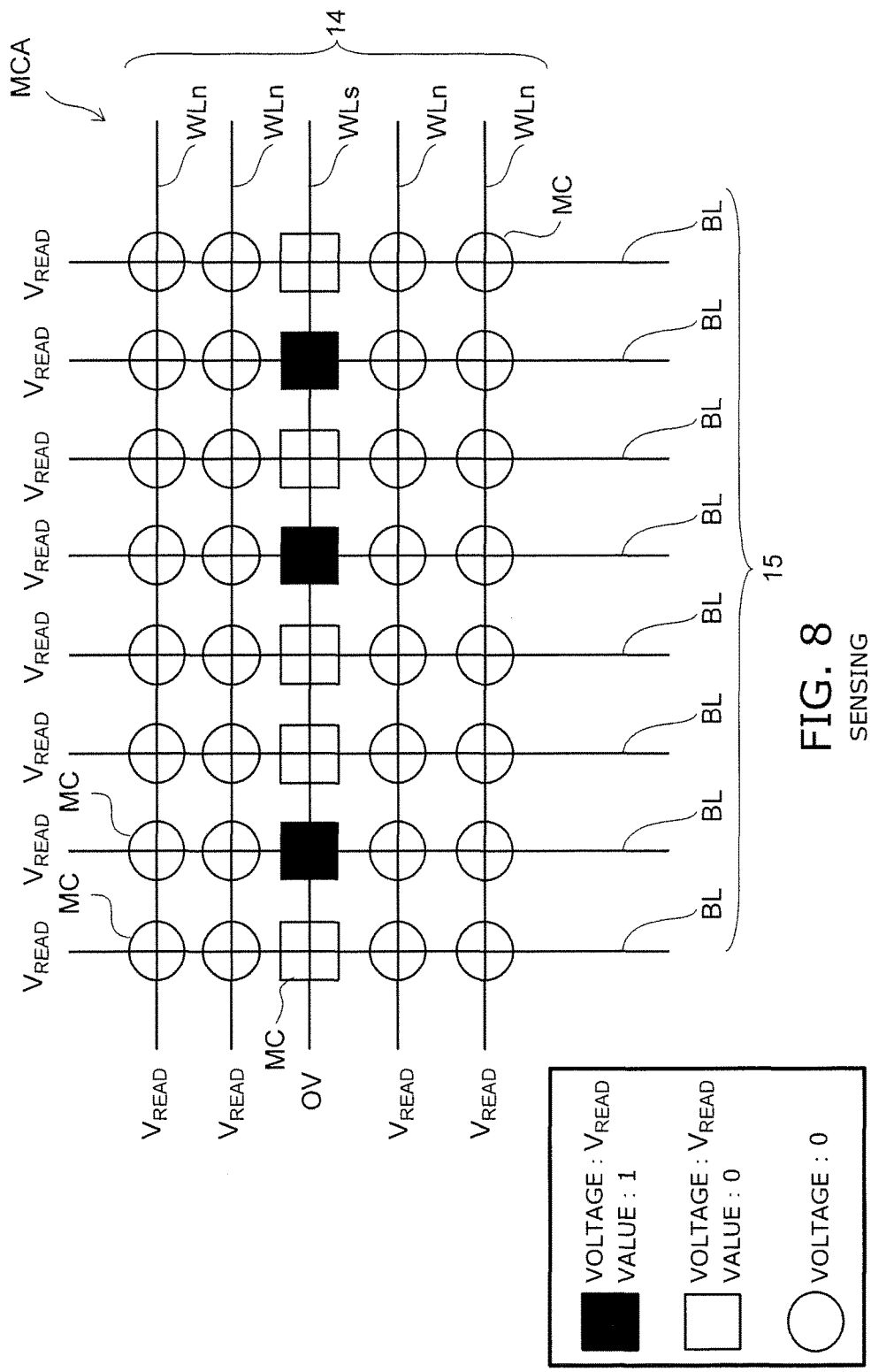

FIG. 7 to FIG. 9 are drawings showing the potentials applied to the interconnects and the state of the memory cells in the erasing operation of the resistance random access memory device according to the embodiment.

In FIG. 7 to FIG. 9, the memory cells MC having the value "1" to which the voltage is applied are shown by black rectangles (■); the memory cells MC having the value "0" to which the voltage is applied are shown by white rectangles (□); and the memory cells MC to which the voltage is not applied are shown by white circles (○).

First, as shown in FIG. 6 and FIG. 7 and step S1 of FIG. 5, in a state in which all of the bit lines BL are set to the reference potential, e.g., 0 V (zero volts), the selected word line WLs is set to a first erasing potential $V_{ERASE}1$ that is higher than 0 V; and the unselected word lines WLn are set to 0 V. Thereby, the first erasing voltage $V_{ERASE}1$ is applied simultaneously to the memory cells MC belonging to the selected page; and a voltage is not applied to the memory cells MC other than the memory cells MC belonging to the selected page. The application time of the first erasing voltage $V_{ERASE}1$ is set to t1.

As a result, for a portion of memory cells MC of the memory cells MC that had the value "1" prior to applying the first erasing voltage $V_{ERASE}1$, the reset is completed; and the values become "0." However, because there is fluctuation in the reset characteristics of the memory cells MC, there are also memory cells MC for which the reset is not ended and the values remain "1." Also, the memory cells MC that have the value "0" prior to applying the first erasing voltage $V_{ERASE}1$ remain as the value "0" even after the first erasing voltage $V_{ERASE}1$ is applied.

Then, as shown in FIG. 6 and FIG. 8 and step S2 of FIG. 5, the verification is performed; and the values of the memory cells belonging to the selected page are sensed. In the embodiment, the sensation is performed by page unit.

Specifically, in a state in which all of the bit lines BL are set to a read-out potential $V_{READ}$ that is higher than 0 V, the selected word line WLs is set to, for example, 0 V; and the unselected word lines WLn are set to the read-out potential $V_{READ}$. Thereby, the read-out voltage $V_{READ}$ is applied simultaneously to the memory cells MC belonging to the selected page; and a voltage is not applied to the memory cells MC other than the memory cells MC belonging to the selected page. The polarity of the read-out voltage $V_{READ}$ is the reverse of the polarity of the first erasing voltage $V_{ERASE}1$ and is the same as the polarity of the set voltage applied to set the memory cells MC. For example, the magnitude of the read-out voltage $V_{READ}$ is determined to be in a range that is lower than the set voltage and higher than a voltage that is half of the set voltage.

As a result, a current flows simultaneously between the selected word line WLs and the multiple bit lines BL connected to the selected word line WLs via the pillars 16. The resistance states of the pillars 16 are sensed by evaluating the magnitude of the current. The current that flows in each pillar 16 is different due to the value of the memory cell MC; and a larger current flows in the memory cells MC having the value "1" than in the memory cells MC having the value "0." Because the currents flowing in all of the memory cells MC belonging to the selected page merge in the selected word line WLs, the object of the evaluation is the total value of the current. Therefore, although the values of each of the memory cells MC cannot be sensed, it can be sensed how many memory cells of the memory cells MC belonging to the selected page have the value "1."

As shown in step S3 of FIG. 5, in the case where all of the values of the memory cells of the memory cells MC belonging to the selected page are "0," i.e., in the case where all of the memory cells are reset, the reading of the individual memory cells MC inside the page is performed; and after confirming all to be "0," the erasing operation ends. On the other hand, in the case where there is one or more memory cells MC having the value "1," the flow proceeds to step S4.

In step S4 of FIG. 5 as shown in FIG. 6 and FIG. 9, in a state in which all of the bit lines BL are set to, for example, 0 V, the selected word line WLs is set to a second erasing potential $V_{ERASE}2$ that is higher than 0 V and lower than the first erasing potential $V_{ERASE}1$; and the unselected word lines WLn are set to 0 V. Thereby, the second erasing voltage $V_{ERASE}2$ is applied simultaneously to the memory cells MC belonging to the selected page; and a voltage is not applied to the memory cells MC other than the memory cells MC belonging to the selected page. The second erasing voltage $V_{ERASE}2$ has the same polarity as the first erasing voltage $V_{ERASE}1$ and is lower than the first erasing voltage $V_{ERASE}1$. The application time of the second erasing voltage $V_{ERASE}2$ is taken as a time t2 and is longer than the time t1. In other words, in step S4, a lower voltage is applied for a longer time compared to step S1. In an example, the second erasing voltage $V_{ERASE}2$ is lower than the first erasing voltage $V_{ERASE}1$ by about 1 V. Also, the time t2 is about 10 to 20 times the time t1.

Thereby, in the stage after applying the first erasing voltage $V_{ERASE}1$ the reset of the memory cells MC for which the reset is not completed progresses; and the values of some or all of the memory cells MC become "0." FIG. 9 shows the case where the values of all of the memory cells MC belonging to the selected page have become "0."

Then, the flow returns to step S2 of FIG. 5; and as shown in FIG. 6 and FIG. 8, the values of the memory cells belonging to the selected page are sensed again. Then, if all of the memory cells MC are reset, the erasing operation ends; and if there is a memory cell MC that is not reset, the flow proceeds again to step S4; and the second erasing voltage $V_{ERASE}2$ is applied. Thus, the operations shown in steps S2 to S4 are repeated until all of the memory cells belonging to the selected page are reset and the values become "0." The erasing operation of the selected page ends at the point in time when all of the memory cells belonging to the selected page are reset. Then, the next page is selected; and the erasing operation is implemented similarly. Thus, the entire block may be erased by repeating the erasing operation by page; and the erasing operation may be stopped at any page.

Effects of the embodiment will now be described.

Figure 10A:
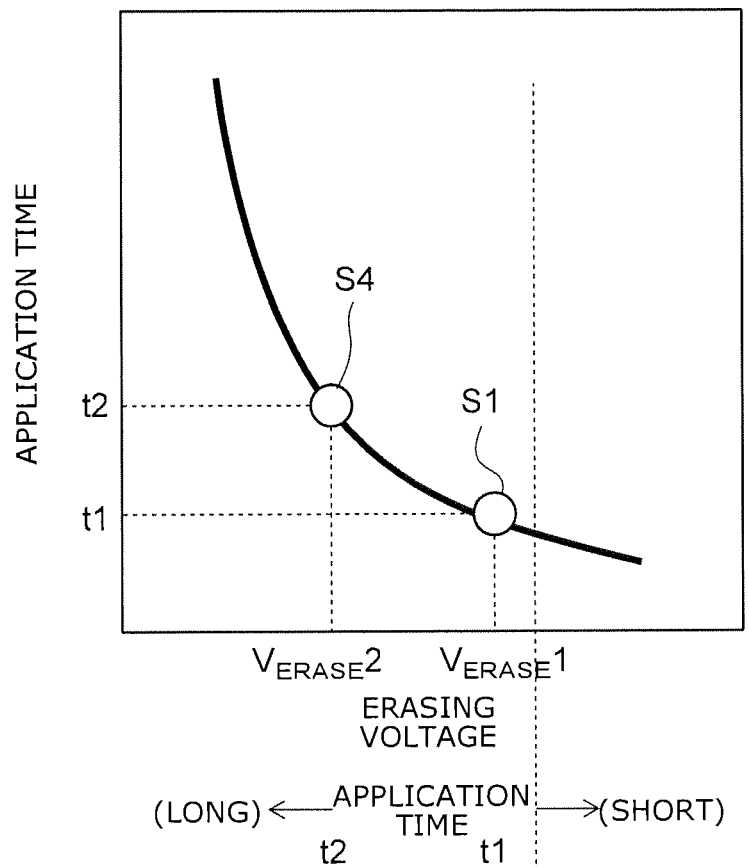
FIG. 10A is a graph showing relationship between erasing voltage and application time at which half of the memory cells are reset, in which the horizontal axis is the erasing voltage, and the vertical axis is the application time.

FIG. 10A is a graph showing the relationship between the erasing voltage and the application time at which half of the memory cells are reset, in which the horizontal axis is the erasing voltage, and the vertical axis is the application time.

Figure 10B:
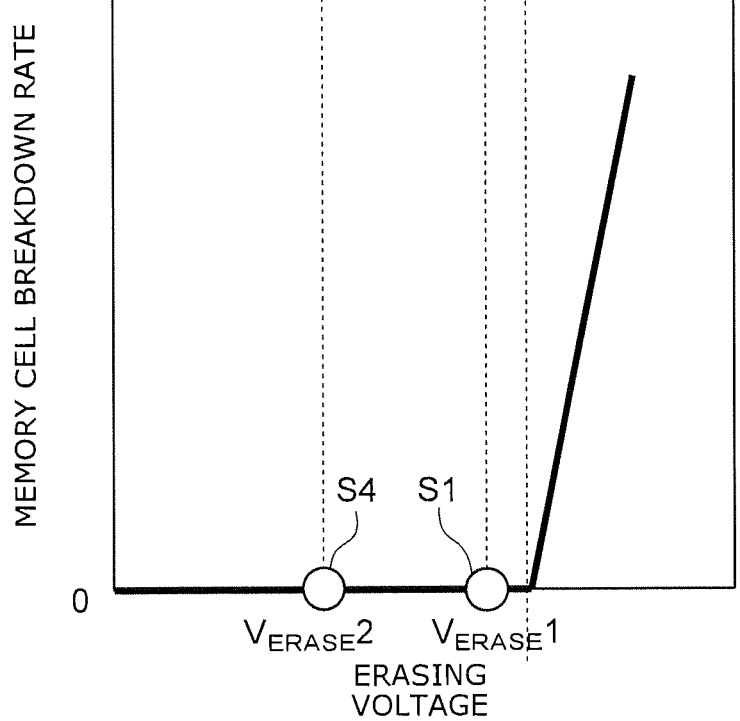
FIG. 10B is a graph showing relationship between the erasing voltage and breakdown rate, in which the horizontal axis is the erasing voltage, and the vertical axis is the memory cell breakdown rate.

FIG. 10B is a graph showing the relationship between the erasing voltage and the breakdown rate, in which the horizontal axis is the erasing voltage, and the vertical axis is the memory cell breakdown rate.

As shown in FIG. 10A, if the erasing voltage is set to be high, it is possible to increase the speed of the device 1 because the application time until the reset is completed can be short. However, as shown in FIG. 10B, if the erasing voltage is set to be higher than a constant, the memory cell breakdown rate undesirably becomes high. In other words, as shown in FIG. 3C, breakdown of the variable resistance layer 22 occurs; and the likelihood of breakdown of the memory cell MC becomes high.

In particular, in the case where the reset of a portion of the memory cells is not completed after applying the prescribed erasing voltage, when applying the same erasing voltage as the voltage when trying to reset the memory cells that were not reset, for the memory cells that are already reset, a high voltage is applied to the variable resistance layer 22 because the filament F is broken. Therefore, breakdown of the memory cells that were reset previously occurs easily when applying the erasing voltage for the second and subsequent times.

On the other hand, as shown in FIG. 10B, if the erasing voltage is set to be low, the likelihood of the breakdown of the memory cell MC is low even if the erasing voltage is repeatedly applied. However, if the erasing voltage is set to be low as shown in FIG. 10A, a long application time is necessary; and the operation speed of the device 1 undesirably decreases.

Therefore, in the embodiment, the erasing voltage that is applied initially is set to the erasing voltage $V_{ERASE}1$ that is as high as possible in a range in which the memory cell breakdown rate does not increase; and the erasing operation is performed efficiently for a short application time t1. Thereby, for the greater part of the memory cells, the reset is completed and the value is "0;" or the reset is in a state of being nearly completed.

Then, the erasing voltage that is applied for the second and subsequent times is set to the erasing voltage $V_{ERASE}2$ that is lower than the erasing voltage $V_{ERASE}1$; and the application time is set to the time t2 that is longer than t1. Thereby, the reset of the memory cells for which the reset is not yet completed can be caused to progress reliably; and the breakdown of the memory cells that are already reset is suppressed. Thus, both the high speed and reliability of the erasing operation can be realized.

Also, in the embodiment, in the process shown in step S2 of FIG. 5 and the process shown in step S4, the determination of whether or not the erasing operation has completed is performed by applying the read-out voltage $V_{READ}$ to all of the memory cells MC belonging to the selected page and sensing the values of the memory cells by page unit. Thereby, compared to the case where the values of the memory cells are sensed individually each time the erasing voltage is applied, the time necessary for the sensing is reduced; and a higher erasing operation speed can be realized.

Second Embodiment

A second embodiment will now be described.

In the embodiment, the values are sensed for each memory cell in step S2 of FIG. 5.

Figure 11:
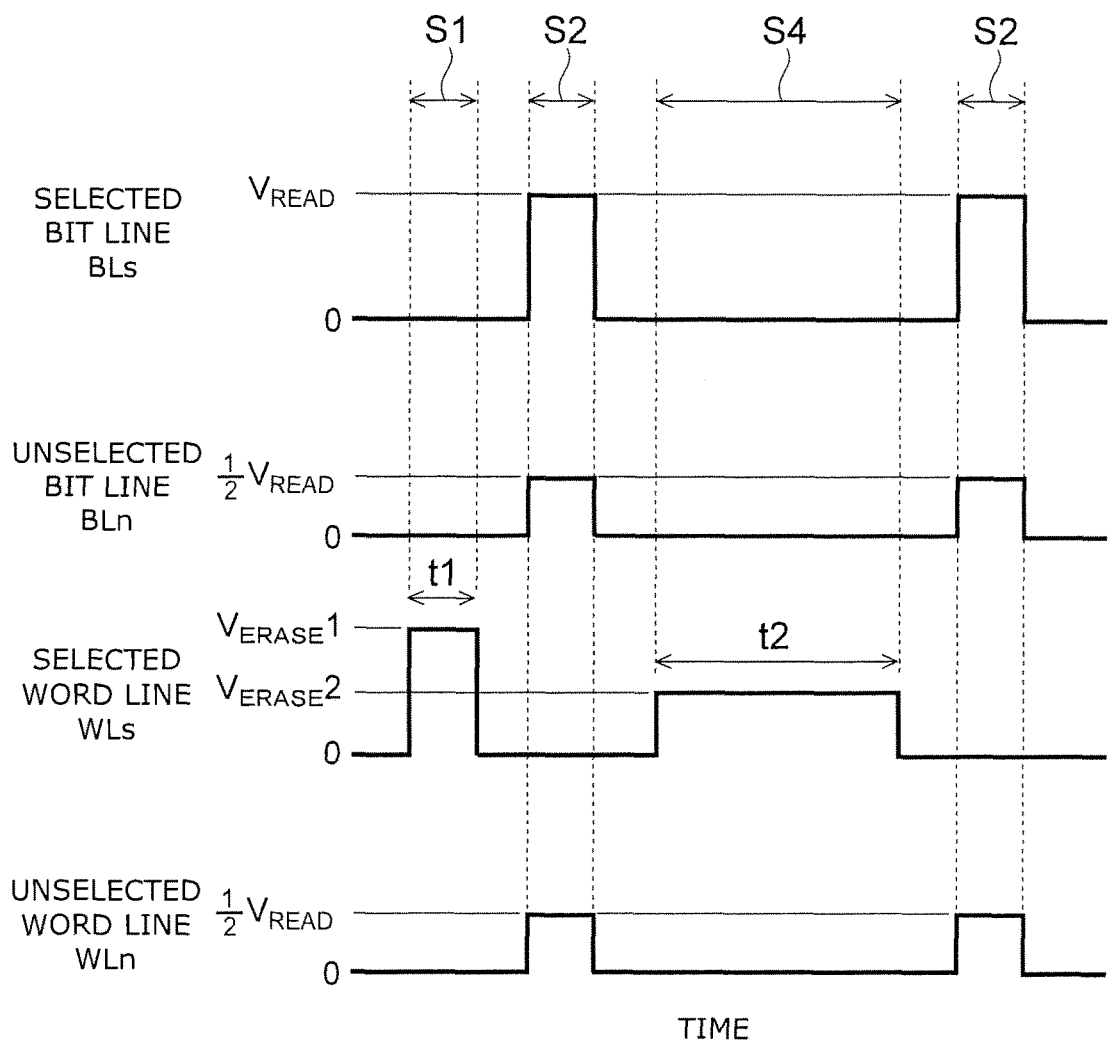
FIG. 11 is a waveform diagram showing an erasing operation of a resistance random access memory device according to a second embodiment, in which the horizontal axis is time, and the vertical axis is a potential of each unit.

FIG. 11 is a waveform diagram showing the erasing operation of the resistance random access memory device according to the embodiment, in which the horizontal axis is the time, and the vertical axis is the potential of each unit.

FIG. 12 is a drawing showing the potentials applied to the interconnects in the erasing operation of the resistance random access memory device according to the embodiment.

In the embodiment as shown in FIG. 11 and FIG. 12, in the sensing of the values of the memory cells shown in step S2 of FIG. 5, the bit line BL (hereinbelow, called the "selected bit line BLs") that is connected to the memory cell MC (hereinbelow, called the "selected memory cell MCs") to be sensed is set to the read-out potential $V_{READ}$; the bit lines BL (hereinbelow, called the "unselected bit lines BLn") other than the bit line BL connected to the memory cell MC to be sensed are set to a half read-out potential $V_{READ}/2$; the selected word line WLs that is connected to the selected memory cell MCs is set to the reference potential, e.g., 0 V; and the unselected word lines WLn other than the selected word line WLs is set to the half read-out potential $V_{READ}/2$. The half read-out potential $V_{READ}/2$ has the same polarity as the read-out potential $V_{READ}$ and has half the magnitude.

Thereby, the read-out voltage $V_{READ}$ is applied to the selected memory cell MCs. The half read-out voltage $V_{READ}/2$ is applied to the memory cells MC connected between the unselected word lines WLn and the selected bit line BLs and to the memory cells MC connected between the selected word line WLs and the unselected bit lines BLn. A voltage is not applied to the memory cells MC connected between the unselected bit lines BLn and the unselected word lines WLn.

Then, the value of the selected memory cell MCs can be sensed by evaluating the magnitude of the current flowing between the selected bit line BLs and the selected word line WLs. Because the I-V characteristics of the pillar 16 are nonlinear, even for the same value of the memory cell MC, the magnitude of the current flowing when the half read-out voltage $V_{READ}/2$ is applied is smaller than half of the magnitude of the current flowing when the read-out voltage $V_{READ}$ is applied. Therefore, of the current that flows in the selected word line WLs, the current that flows through the selected memory cell MCs is dominant.

In the embodiment as shown in FIG. 11, the application of the erasing voltage $V_{ERASE}1$ shown in step S1 and the application of the erasing voltage $V_{ERASE}2$ shown in step S4 are similar to those of the first embodiment described above.

According to the embodiment, the values of the memory cells MC can be sensed with high precision because the values of the memory cells MC belonging to the selected page each can be sensed.

Otherwise, the configuration, the operating method, and the effects of the embodiment are similar to those of the first embodiment described above.

According to the embodiments described above, a resistance random access memory device and a method for operating the resistance random access memory device in which the operations are high-speed and the reliability is high can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A resistance random access memory device, comprising:
    a first interconnect layer including a plurality of first interconnects, the plurality of first interconnects extending in a first direction and being arranged along a second direction, the second direction crossing the first direction;
    a second interconnect layer including a plurality of second interconnects and being arranged in a third direction with the first interconnect layer, the third direction being orthogonal to both the first direction and the second direction, the plurality of second interconnects extending in the second direction and being arranged along the first direction;
    variable resistance members connected between the first interconnects and the second interconnects; and
    a control circuit applying a first voltage between the plurality of second interconnects and one of the first interconnects for a first time when switching resistance states of the variable resistance members from a first state to a second state, and the control circuit applying a second voltage between the plurality of second interconnects and the one of the first interconnects for a second time after applying the first voltage when the resistance state of one or more of the variable resistance members of a plurality of the variable resistance members connected to the one of the first interconnects is in the first state, the second voltage having the same polarity as the first voltage and being lower than the first voltage, the second time being longer than the first time.

2. The device according to claim 1, wherein the control circuit repeats the applying of the second voltage until the resistance states of all of the variable resistance members connected to the one of the first interconnects are switched to the second state.

3. The device according to claim 1, wherein the control circuit senses, after applying the first voltage and prior to applying the second voltage, the resistance states of the plurality of variable resistance members connected to the one of the first interconnects by applying a third voltage simultaneously between the plurality of second interconnects and the one of the first interconnects, the third voltage having the reverse polarity of the first voltage.

4. The device according to claim 1, wherein the control circuit senses, after applying the first voltage and prior to applying the second voltage, the resistance state of the variable resistance member by applying a third voltage between one of the plurality of second interconnects and the one of the first interconnects, the third voltage having the reverse polarity of the first voltage.

5. The device according to claim 1, wherein a resistance value of the variable resistance member in the second state is higher than a resistance value of the variable resistance member in the first state.

6. The device according to claim 5, wherein
    the variable resistance member includes:
        a metal layer; and
        a variable resistance layer connected between the first interconnect and the metal layer, a resistivity of the variable resistance layer being higher than a resistivity of the metal layer, ions of a metal included in the metal layer being capable of reversibly passing through an interior of the variable resistance layer, and
    the first voltage makes a potential of the first interconnect higher than a potential of the second interconnect.

7. The device according to claim 5, wherein
    the variable resistance member includes:
        a metal layer including silver or copper; and
        a variable resistance layer including silicon and oxygen and being connected between the first interconnect and the metal layer, and
    the first voltage makes a potential of the first interconnect higher than a potential of the second interconnect.

8. The device according to claim 1, wherein the first interconnect layer and the second interconnect layer are stacked alternately along the third direction.

* * * * *